United States Patent
Leighton et al.

(10) Patent No.: US 9,673,113 B2
(45) Date of Patent: Jun. 6, 2017

(54) METHOD AND SYSTEM FOR REAL-TIME POLISHING RECIPE CONTROL

(71) Applicant: Applied Materials, Inc., Santa Clara, CA (US)

(72) Inventors: Jamie S. Leighton, Palo Alto, CA (US); Yee Sheen Pong, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 370 days.

(21) Appl. No.: 14/327,491

(22) Filed: Jul. 9, 2014

(65) Prior Publication Data

US 2015/0357252 A1 Dec. 10, 2015

Related U.S. Application Data

(60) Provisional application No. 62/008,300, filed on Jun. 5, 2014.

(51) Int. Cl.
| | |
|---|---|
| G06F 19/00 | (2011.01) |
| H01L 21/66 | (2006.01) |
| B24B 37/005 | (2012.01) |
| B24B 49/04 | (2006.01) |
| H01L 21/306 | (2006.01) |
| H01L 21/67 | (2006.01) |

(52) U.S. Cl.
CPC ............ H01L 22/26 (2013.01); B24B 37/005 (2013.01); B24B 49/04 (2013.01); H01L 21/30625 (2013.01); H01L 21/67075 (2013.01); H01L 21/67092 (2013.01); H01L 21/67253 (2013.01)

(58) Field of Classification Search
CPC .............. H01L 22/26; H01L 21/67075; H01L 21/30625; H01L 21/67092; H01L 21/67253; B24B 49/04; B24B 37/005
See application file for complete search history.

(56) References Cited

U.S. PATENT DOCUMENTS

| | | | |
|---|---|---|---|
| 6,271,047 B1 * | 8/2001 | Ushio | B24B 37/013 |
| | | | 257/E21.528 |
| 2003/0205664 A1 * | 11/2003 | Abe | B24B 37/013 |
| | | | 250/214 R |
| 2006/0237330 A1 | 10/2006 | Manens et al. | |
| 2007/0155284 A1 | 7/2007 | Ring et al. | |
| 2008/0068997 A1 * | 3/2008 | Krause | H04N 21/23406 |
| | | | 370/232 |
| 2008/0312876 A1 * | 12/2008 | Lin | B24B 37/042 |
| | | | 702/182 |

(Continued)

OTHER PUBLICATIONS

International Search Report and the Written Opinion of the International Searching Authority for International Application No. PCT/US2015/034213 mailed Aug. 31, 2015, 12 pages.

*Primary Examiner* — Michael D Masinick
(74) *Attorney, Agent, or Firm* — Lowenstein Sandler LLP

(57) ABSTRACT

Systems and methods are provided for controlling a polishing process in real-time. First and second characteristics are identified in first and second data sets, respectively, with each data set corresponding to a real-time wafer polishing data. A time delta is computed between the times at which the first and second characteristics occur within their respective data sets, and polishing parameters are then updated in real-time based on the computed time delta.

14 Claims, 6 Drawing Sheets

(56) References Cited

U.S. PATENT DOCUMENTS

| | | | |
|---|---|---|---|
| 2012/0028377 A1* | 2/2012 | David | B24B 37/013 |
| | | | 438/8 |
| 2012/0053721 A1 | 3/2012 | Shanmugasundram et al. | |
| 2012/0100779 A1 | 4/2012 | Dhandapani et al. | |
| 2013/0035888 A1* | 2/2013 | Kandel | G03F 7/70633 |
| | | | 702/81 |
| 2014/0273745 A1* | 9/2014 | Swedek | B24B 49/12 |
| | | | 451/1 |

* cited by examiner

METHOD AND SYSTEM FOR REAL-TIME POLISHING RECIPE CONTROL

CROSS REFERENCE TO RELATED APPLICATION

This application claims the benefit of priority of U.S. Provisional Patent Application No. 62/008,300, filed Jun. 5, 2014, which is hereby incorporated by reference herein in its entirety.

TECHNICAL FIELD

Implementations of the present disclosure relate to chemical mechanical polishing, and more particularly, to controlling chemical mechanical polishing parameters in real-time.

BACKGROUND

Chemical mechanical polishing (CMP) is a procedure used in the semiconductor industry to smooth the surfaces of wafers using a combination of chemical etching and abrasive mechanical forces. The wafer is placed on a rotating platen and held in place by a retaining ring as a polishing head is brought into contact with the wafer. Material is removed from the surface of the wafer, producing a planar surface. The removal rate may vary with pressure applied between the wafer and the polishing head.

In many cases, different regions of the wafer may polish at different rates (e.g., a wafer edge may polish faster than a wafer center). While polishing recipes can be developed and calibrated to compensate for different polishing rates in sets of wafers, inconsistent polishing may still occur from wafer to wafer due to surface irregularities despite prior calibrations.

BRIEF DESCRIPTION OF THE DRAWINGS

The present disclosure is illustrated by way of example, and not by way of limitation, in the figures of the accompanying drawings in which like references indicate similar elements. It is noted that different references to "an" or "one" implementation in this disclosure are not necessarily to the same implementation, and such references mean at least one.

DETAILED DESCRIPTION

Implementations of the disclosure are directed to a method and system controlling a wafer polishing recipe in real-time. An in situ rate monitoring system monitors material removal rates in real-time during a polishing process performed by a CMP system. As the wafer is polished, metrology data (referred to as "segment files"), which is measured by the in situ rate monitoring system at different regions of the wafer, may include recognizable characteristics that occur at different points in time and are thickness dependent. The CMP system compares data from the different segment files to determine one or more time deltas between when these characteristics occur in time. Based on the time deltas, the CMP system then identifies updated polishing parameters (e.g., based on a look-up table), and updates its polishing recipe in real-time to compensate for any differences in polishing rates at the different regions of the wafer.

Figure 1:
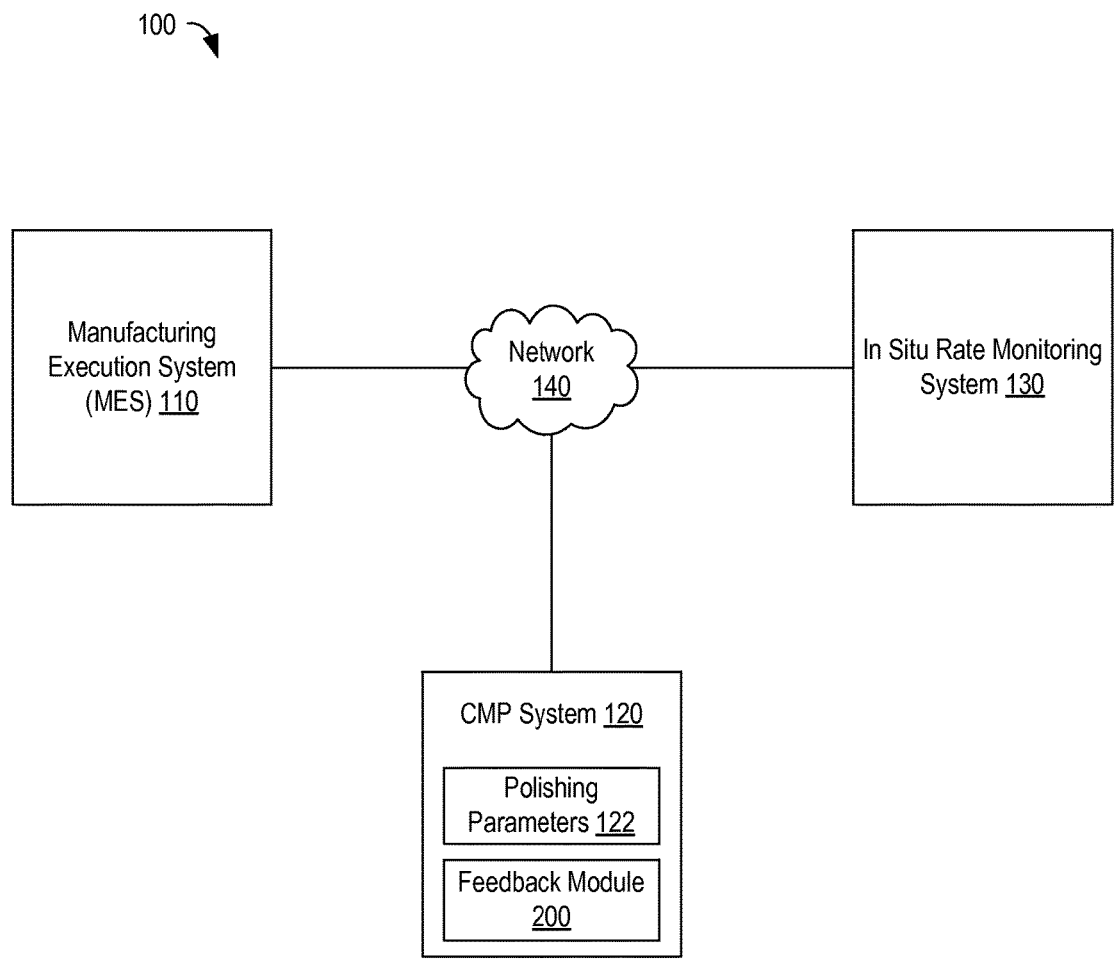
FIG. 1 is a block diagram illustrating a chemical mechanical polishing according to one implementation.

FIG. 1 is a block diagram illustrating a manufacturing system 100 including a fabrication system data source (e.g., manufacturing execution system (MES) 110), a chemical mechanical polishing (CMP) system 120, and an in situ rate monitoring (ISRM) system 130, with each system/server configured to communicate with each other, for example, via a network 140. The network 140 can be a local area network (LAN), a wireless network, a mobile communications network, a wide area network (WAN), such as the Internet, or similar communication system.

The MES 110, CMP system 120, ISRM system 130, and feedback module 200, can be individually hosted by any type of computing device including server computers, gateway computers, desktop computers, laptop computers, tablet computers, notebook computers, personal digital assistants (PDAs), mobile communications devices, cell phones, smart phones, hand-held computers, or similar computing devices. Alternatively, any combination of MES 110, CMP system 120, ISRM system 130, and feedback module 200 can be hosted on a single computing device including server computers, gateway computers, desktop computers, laptop computers, mobile communications devices, cell phones, smart phones, hand-held computers, or similar computing devices.

The ISRM system 130 can collect and analyze data relating to CMP system 120. In one implementation, the ISRM system 130 is coupled to a factory system data source (e.g., MES 110, ERP) to receive scheduling data and equipment (e.g., chamber) data, etc. In one implementation, the ISRM system 130 can capture data measurement data during a wafer polishing process performed by CMP system 120. The CMP system 120 may include a feedback module 200 that receives the measurement data from the ISRM system 130 and processes the data to update polishing parameters 122 used by the CMP system 120 in the wafer polishing process. For example, the feedback module 200 can analyze real-time data wafer polishing data, determine if different regions of a wafer are being polished at different rates by the CMP system, and update the polishing parameters/settings the CMP system 120, which in turn adjusts the polishing rates of the different regions.

Figure 2A:
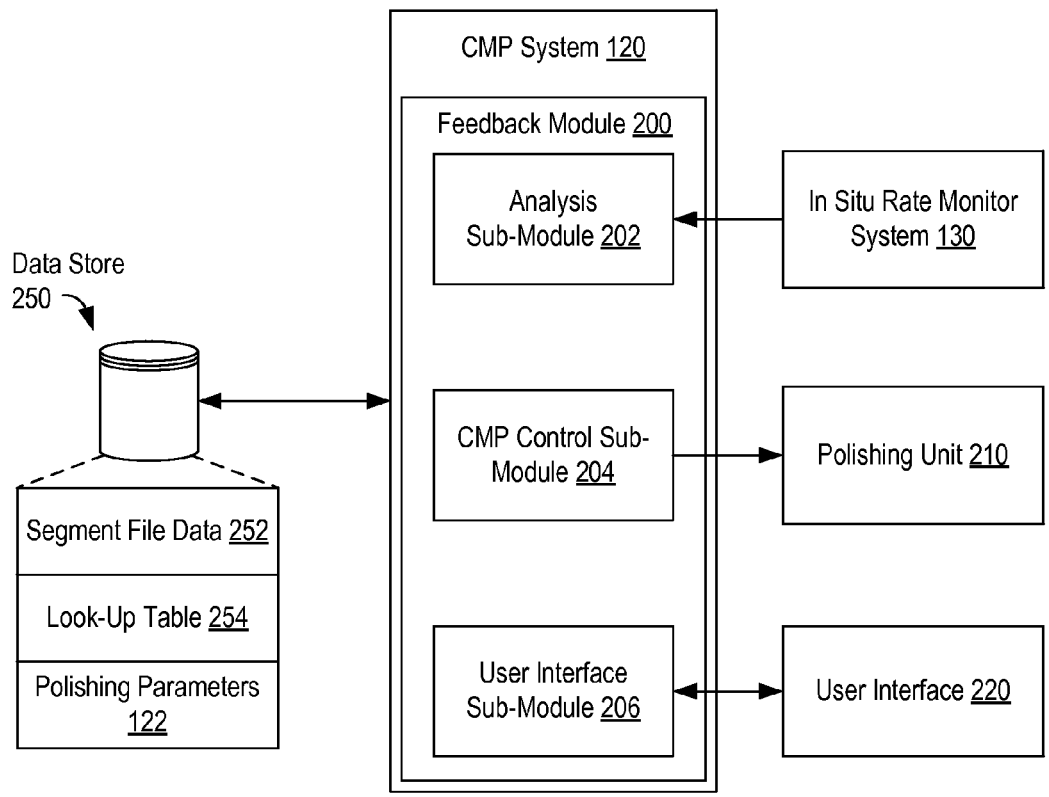
FIG. 2A a block diagram of one implementation of a feedback module according to one implementation.

FIG. 2A is a block diagram of one implementation of a feedback module 200 according to one implementation. In one implementation, the feedback module 200 can be the same as the feedback module 200 of FIG. 1. The feedback module may be implemented on CMP system 120, and may include an analysis sub-module 202, a CMP control sub-module 204, and a user interface (UI) sub-module 206.

The feedback module 200 can be coupled to a data store 250. The data store 250 can be a persistent storage unit, which may be a local storage unit or a remote storage unit. The persistent storage unit can be a magnetic storage unit, optical storage unit, solid state storage unit, electronic storage unit (main memory) or similar storage unit. The persistent storage unit can also be a monolithic device or a distributed set of devices. A 'set', as used herein, refers to any positive whole number of items. In some implementations, the data store 250 may be maintained on any device available via the network 140. For example, data store 250 may be maintained on a server computer, gateway computer, desktop computer, laptop computer, mobile communications device, cell phone, smart phone, hand-held computer, or similar computing device.

The data store 250 can store segment file data 252, look-up table 254, and polishing parameters 122. The segment file data 252 can include segment files that contain measurement data obtained from different regions of a wafer during a chemical mechanical polishing process. For example, a first segment file may correspond to reflectivity versus time data observed at an edge of a wafer, and a second segment file may correspond to reflectivity versus time data observed at a central region of the wafer. In some embodiments, the segment file data 252 is received from the ISRM system 130. For example, the analysis sub-module 202 receives and stores segment file data 252 in real-time as it is streamed from the ISRM system 130. The look-up table 254 may include tabulated polishing parameters, including, but not limited to, membrane pressure, inner tube pressure, and retaining ring pressure. The tabulated polishing parameters may be utilized as offsets to correct pressures applied by a polishing head of the CMP system to different regions of the wafer. For example, the CMP control sub-module 204 may retrieve updated polishing parameters from look-up table 254 and dynamically update the polishing recipe (e.g., by controlling one or more pressures applied to the wafer by a polishing unit 210).

In one implementation, user interface (UI) sub-module 206 can present in a user interface 220 one or more of segment file data 252 obtained by CMP system 120, look-up table 254 parameters, or polishing parameters 222. The user interface 220 can be a graphical user interface (GUI) implemented on any suitable device. In one embodiment, if the GUI is implemented on the CMP system, the GUI may display look-up table parameters 254 (e.g., using user interface 220). The GUI may also be implemented on a different device than CMP system 120. In one embodiment, if the GUI is implemented on the ISRM system 130, the GUI may display segment file data 252.

Figure 2B:
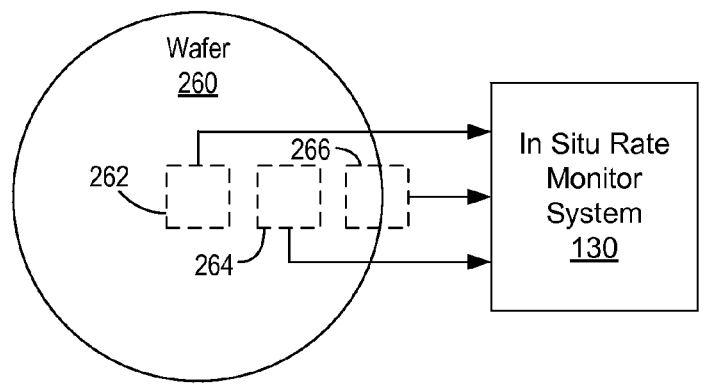
FIG. 2B illustrates monitoring different regions of a wafer during chemical mechanical polishing according to one implementation.

FIG. 2B illustrates monitoring different regions of a wafer during chemical mechanical polishing according to one implementation. ISRM system 130 may configured to perform metrology on a wafer 260 during a polishing process. In one implementation, wafer 260 includes an optically transparent film disposed thereon. CMP system 120 polishes wafer 260, which reduces the thickness of the optically transparent film. Metrology data may be collected by the ISRM system 130 in the form of segment files corresponding, respectively, to center region 262, mid region 264, and edge 266. The collected data may be analyzed in-real time by analysis sub-module 202.

Figure 3:
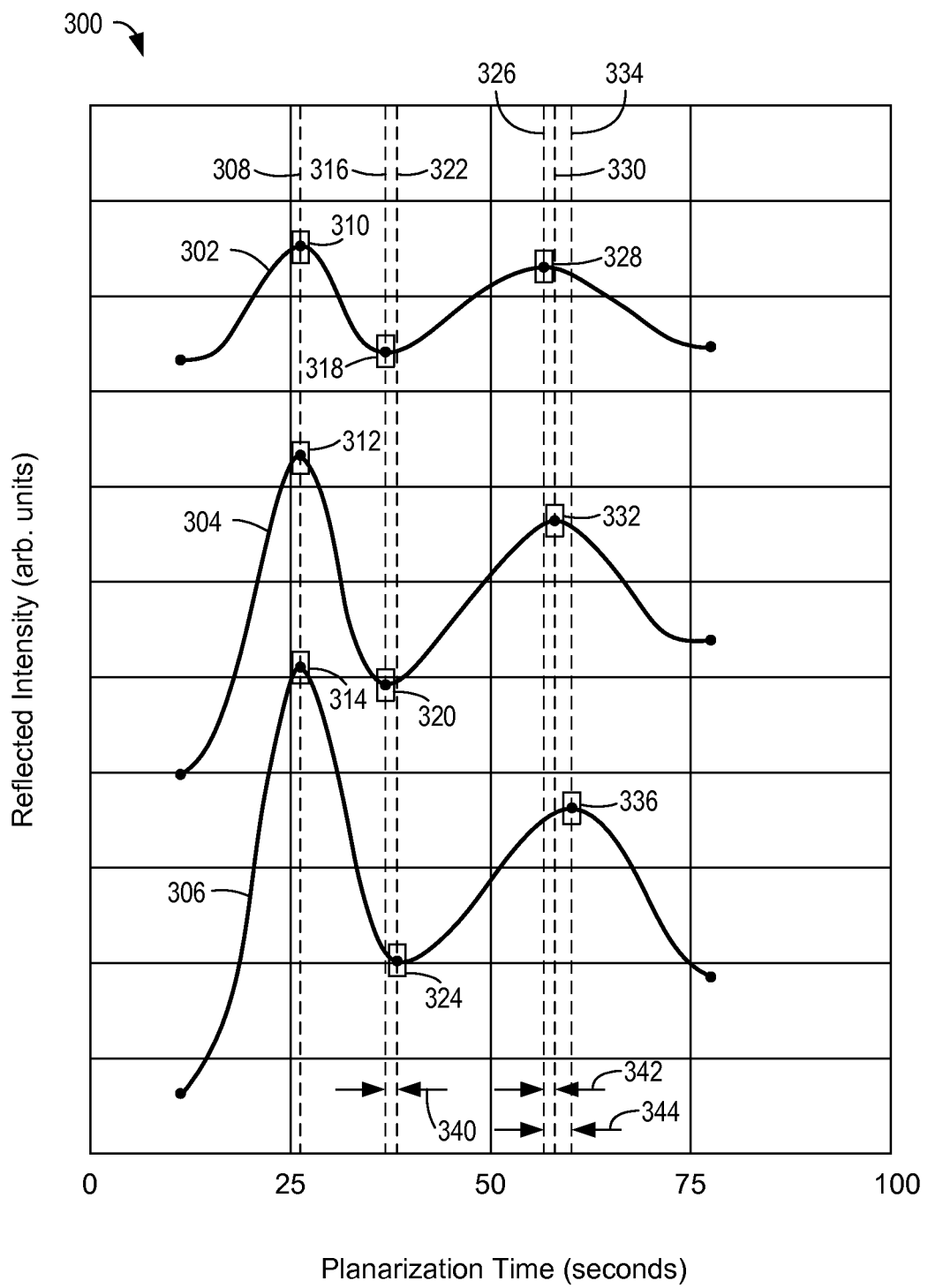
FIG. 3 is a plot illustrating data obtained from monitoring different regions of a wafer according to one implementation.

FIG. 3 is a plot 300 illustrating data obtained from monitoring different regions of a wafer according to one implementation. In one implementation, plot 300 may be presented for display in a GUI (e.g., presented on UI 220), which may update in real-time as data is received by the CMP system. Plot 300 represents segment file data corresponding to real-time measurements taken at various regions of a wafer during a CMP process. The horizontal axis corresponds to planarization time in seconds, which corresponds to a time during a CMP process. The vertical axis corresponds to reflected intensity in arbitrary units. The reflected intensity may be monitored at different regions of the wafer by an ISRM system (e.g., ISRM system 130). In some implementations, different types of processing data may be presented in plot 300.

The feedback module 200 can use the data depicted in plot 300 to update parameters of the CMP process in real-time. Curves 302, 304, 306 correspond to segment file data monitored in real-time during the CMP process. For example, curve 302 may correspond to data obtained at a center of a wafer (e.g., center region 262), curve 304 may correspond to data obtained at a mid-section of the wafer (e.g., mid region 264), and curve 306 may correspond to data obtained at an edge of the wafer (e.g., edge region 266). In one implementation, curves 302, 304, 306 are depicted as smooth curves. In one implementation, curves 302, 304, 306 are depicted as individual data points.

The shapes of each of curves 302, 304, 306 result from reflectivity measurements of one or more films disposed on the wafer, which exhibit characteristics (e.g., local minima and local maxima) that are dependent on film thickness. During the CMP process, the film thickness decreases with time as it is polished. Although the respective data points of curves 302, 304, 306 are time-synchronized, the characteristics of each of curves 302, 304, 306 may occur at different time points due to different planarization rates (e.g., a pressure applied to the wafer edge by a polishing head may be greater than a pressure applied to the wafer center by the polishing head, causing the thickness of the film to decrease at a faster rate at the edge than at the center).

Curve 302 may correspond to a wafer edge, curve 304 may correspond to a wafer mid-section, and curve 306 may correspond to a wafer center. Curve 302 has a first local maximum value occurring at data point 310, which occurs at time point 308 (about 26 seconds into the CMP process). Similarly, data point 312 (corresponding to a local maximum value of curve 304) and data point 314 (corresponding to a local maximum value of curve 306) also occur at time point 308. In one embodiment, curve 302 (the wafer edge curve) may be selected as a reference curve for which analysis sub-module 202 computes time deltas for data points 312, 314 with respect to data point 310 (e.g., a time delta between data point 310 and 312 would be a difference between when each of these data points occur in time). As depicted in plot 300, each of data points 310, 312, 314 coincide with time point 308. Accordingly, a time delta between data point 310 and 312 would be zero, and a time delta between data point 310 and 314 would also be zero, indicating that each of the three regions of the wafer are being polished at the same rate. In one implementation, analysis sub-module 202 takes no action and continues to receive segment file data until new characteristics are identified.

As the CMP process continues, data points 318, 320, 324 are identified. Each of data points 318, 320, 324 correspond to local minima of curves 302, 304, 306, respectively. Both data points 318, 320 occur at a same time point 316, while data point 324 occurs at a time point 322. Analysis sub-module 202 may compute a time delta between data points 318, 320 to be zero. Analysis sub-module 202 may compute a time delta 340 between time point 316 and time point 322 ($\Delta t_1 = t_{edge} - t_{center}$). As depicted in plot 300, time delta 340 is −1 second. This lag indicates that a polishing rate corresponding to curve 306 is less than a polishing rate corresponding to curve 302 (that is, the wafer edge is polishing faster than the wafer center). Accordingly, analysis sub-module 202 may use the value of time delta 340 to identify an updated parameter from look-up table 254. For example, look-up table 254 may be indexed according to time delta values, and an updated pressure parameter (such as a retaining ring pressure) corresponding to −1 seconds may be identified from look-up-table 254 by analysis sub-module 202. Once the updated pressure parameter is identified, CMP control sub-module 204 may transmit the updated pressure parameter to a polishing unit 210 (e.g., a polishing head), which then dynamically updates the pressure applied to the wafer edge (e.g., the updated pressure parameter is a positive value such that the polishing pressure applied to the wafer edge is increased to compensate for the lag observed in the segment file data). In one implementation, the analysis sub-module 202 may take no action with respect to the measured non-zero time delta 340, but may store and flag the time delta 340. The analysis sub-module 202 may take action at a later time if additional non-zero time deltas are observed.

As the CMP process continues, data points 328, 332, 336 are identified. Each of data points 328, 332, 336 correspond to local maxima of curves 302, 304, 306, respectively. Data point 328 occurs at a time point 326, data point 332 occurs at a time point 330, and data point 336 occurs at a time point 334. Analysis sub-module 202 may compute a time delta 342 between time point 326 and time point 330 ($\Delta t_2 = t_{edge} - t_{mid}$), which would be equal to −1 as depicted in plot 300. This lag indicates that a polishing rate corresponding to curve 304 is less than a polishing rate corresponding to curve 302 (that is, the wafer center is polishing faster than the wafer edge). Similarly, analysis sub-module 202 may compute a time delta 344 between time point 326 and time point 334 ($\Delta t_3 = t_{edge} - t_{center}$), which would be equal to −3 as depicted in plot 300. This lag indicates that a polishing rate corresponding to curve 306 is less than a polishing rate corresponding to curve 302 (that is, the wafer center is polishing faster than the wafer mid-section). The analysis sub-module 202 may use the values of time deltas 342, 344 to identify updated parameters from look-up table 254, and CMP control sub-module 204 may transmit the updated parameter to polishing unit 210 to dynamically update the polishing of the wafer mid-section and the wafer edge.

Implementations for controlling the CMP process in real-time are described in greater detail below with respect to FIGS. 4 and 5. It is to be understood that the curve shapes, data points, and times are illustrative of an implementation of the present disclosure, and that other curve shapes, data points, and times are possible in other implementations. In the other implementations, data may be processed in a similar fashion using any suitable approach to identify and compare characteristics of real-time data.

Figure 4:
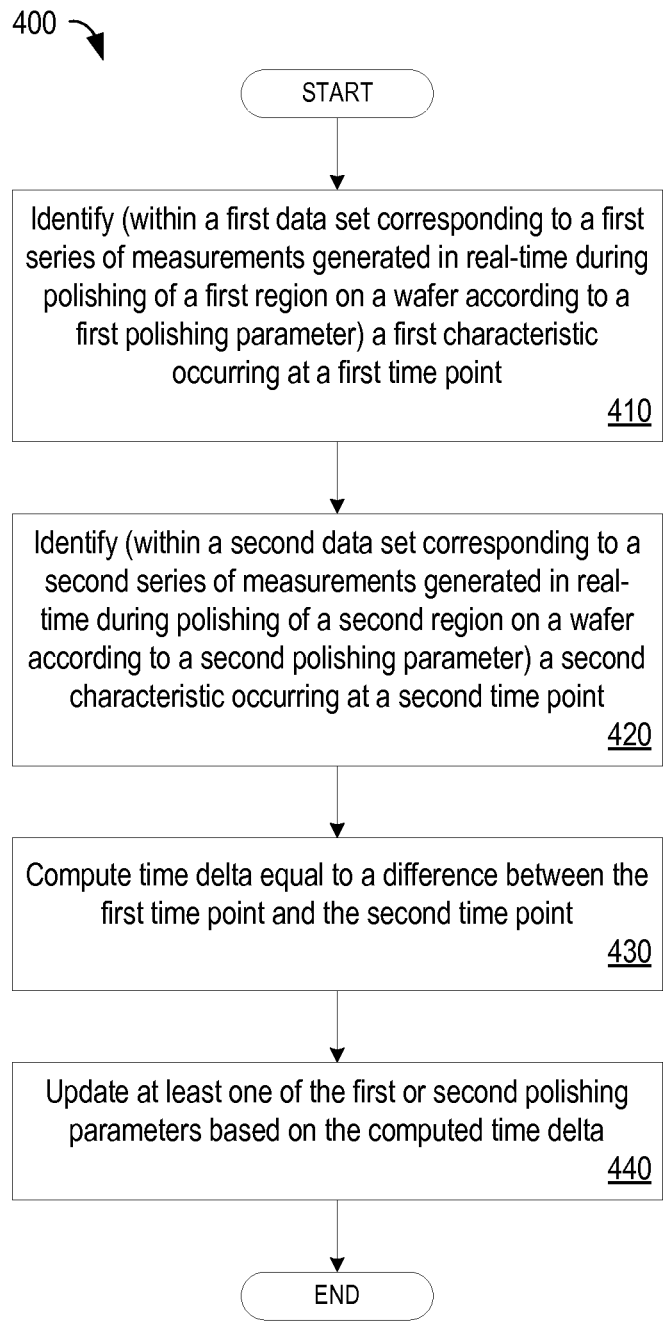
FIG. 4 illustrates an implementation of a method for updating parameters of a polishing process in real time.

FIG. 4 illustrates an implementation of a method 400 for updating parameters of a polishing process in real time. Method 400 can be performed by processing logic that can comprise hardware (e.g., circuitry, dedicated logic, programmable logic, microcode, etc.), software (e.g., instructions run on a processing device), or a combination thereof. In one implementation, method 400 is performed by a CMP system (e.g., feedback module 200 of ISRM system 130 described with respect to FIG. 1), as described below. It is noted, however, that any suitable computing device described herein can perform method 400, and that the CMP system is an illustrative example.

At block 410, a feedback module (e.g., feedback module 200) identifies a first characteristic corresponding to a first time point within a first data set corresponding to a first series of measurements generated in real-time during polishing of a first region on a wafer according to a first polishing parameter. In one implementation, the first data set is a segment file corresponding to a first region of the wafer undergoing as it undergoes a polishing process performed by a CMP system (e.g., CMP system 120). The first region of the wafer may be, for example, a wafer edge, a wafer center, or a wafer mid-section. The first data set (segment file) may be monitored in real-time by an ISRM system (e.g., ISRM system 130) and stored in a memory (e.g., data store 250). In one implementation, the first data set may correspond to reflected intensity versus time data, in which the reflected intensity of light passed through an optically transparent film is measured by a reflectometer of the CMP system or ISRM system. The reflected intensity varies with decreasing film thickness resulting from the polishing process, producing local minima and local maxima characteristics in the first data set. In some implementations, other types of metrology/characterization techniques may be used to obtain different types of polishing data, such as measurements of refractive index.

At block 420, the feedback module identifies a second characteristic corresponding to a second time point within a second data set corresponding to a second series of measurements generated in real-time during polishing of a second region on a wafer according to a second polishing parameter. Block 420 may be performed in a substantially similar manner as block 410 with respect to the second data set. The second region of the wafer may be, for example, a wafer edge, a wafer center, or a wafer mid-section, and is a different region than the first region of the wafer.

At block 430, the feedback module computes a time delta that is equal to a difference between the first time point and the second time point. In one implementation, the first and second characteristics are similar characteristics (e.g., both local maxima) that occur close to each other in time (e.g., within about 10 seconds). At block 440, the feedback module updates (e.g., using CMP control sub-module 204) at least one of the first or second polishing parameters based on the computed time delta. In some implementations, block 440 may be omitted if the feedback module determines that the time delta is equal to zero.

Figure 5:
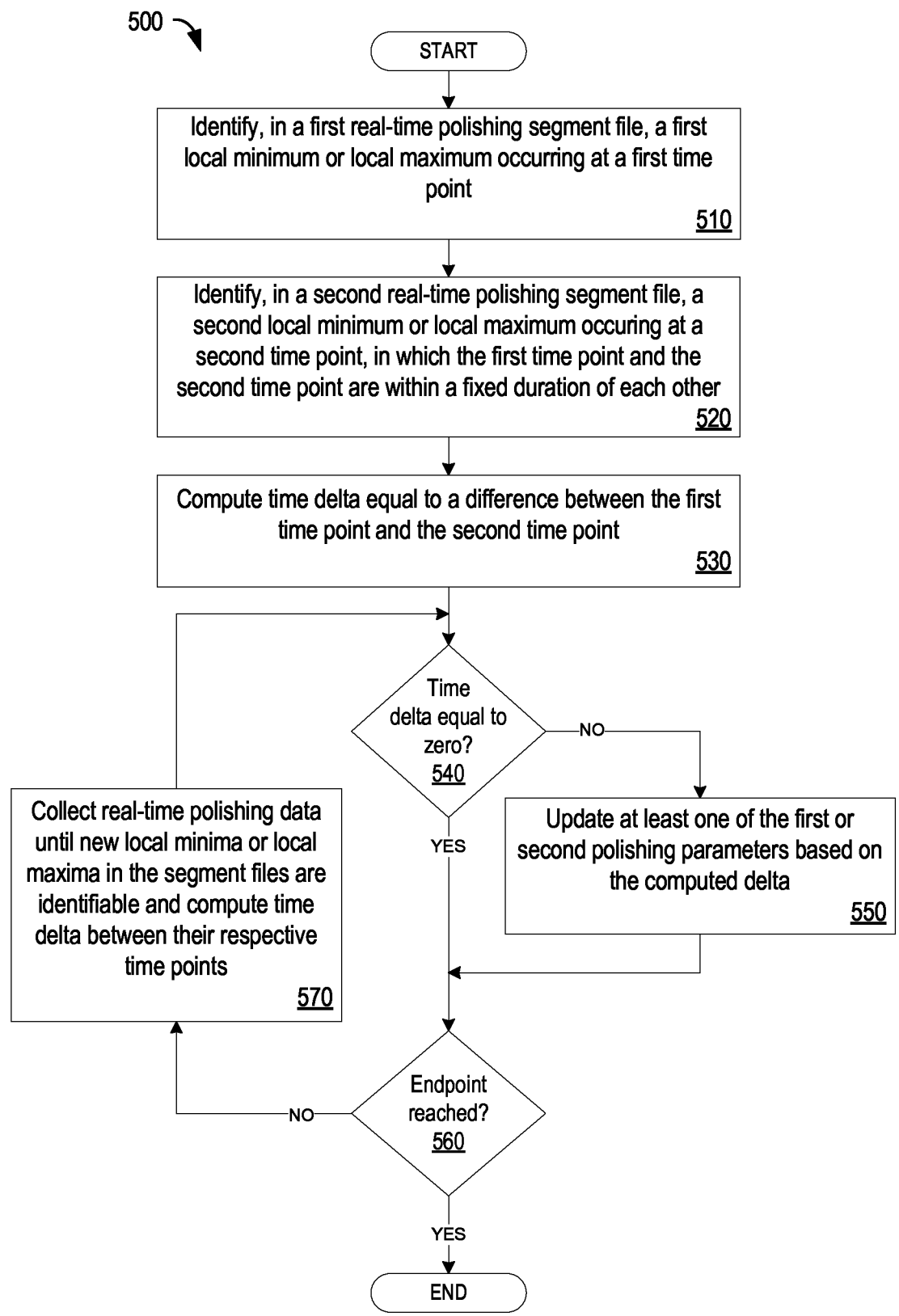
FIG. 5 illustrates an implementation of a method for continuously updating parameters of a polishing process in real time.

FIG. 5 illustrates an implementation of a method 500 for continuously updating parameters of a polishing process in real time. Method 500 can be performed by processing logic that can comprise hardware (e.g., circuitry, dedicated logic, programmable logic, microcode, etc.), software (e.g., instructions run on a processing device), or a combination thereof. In one implementation, method 500 is performed by a CMP system (e.g., feedback module 200 of ISRM system 130 described with respect to FIG. 1), as described below. It is noted, however, that any suitable computing device described herein can perform method 500, and that the CMP system is an illustrative example.

At block 510, a feedback module (e.g., feedback module 200) identifies a first characteristic corresponding to a first time point within a first data set corresponding to a first series of measurements generated in real-time during polishing of a first region on a wafer according to a first polishing parameter. Block 510 may be the same or similar to block 410 described with respect to FIG. 4.

At block 520, the feedback module (e.g., feedback module 200) identifies a first characteristic corresponding to a first time point within a first data set corresponding to a first series of measurements generated in real-time during polishing of a first region on a wafer according to a first polishing parameter. Block 520 may be the same or similar to block 420 described with respect to FIG. 4.

At block 530, the feedback module computes a time delta that is equal to a difference between the first time point and the second time point (e.g., the second time point is subtracted from the first time point). Block 530 may be the same or similar to block 430 described with respect to FIG. 4.

At block 540, the feedback module determines if the computed time delta is equal to zero. If the computed time delta is not equal to zero, method 500 proceeds to block 550. At block 550, the feedback module updates at least one of the first or second polishing parameters based on the computed delta. In one implementation, a new parameter value may be identified within a look-up table (e.g., look-up table 254). The new parameter value may be assigned to at least one of the first or second polishing parameters, for example, by replacing a stored polishing parameter with the new parameter (e.g., storing the new parameter value in place of the old parameter value in data store 250). In one implementation, the feedback module may update the first and/or second polishing parameters by transmitting the updated parameters to a polishing unit (e.g., polishing unit 210), which in turn adjusts the polishing settings (e.g., pressure applied to various regions of the wafer).

In one implementation, the feedback module may determine that the time delta is negative (e.g., the second time point occurs at a later time than the first time point). The feedback module may then increase the second polishing parameter to compensate for the difference between the first and second time values (e.g., by increasing a polishing pressure applied to the region corresponding to the second data set). In one implementation, the feedback module may determine that the time delta is positive (e.g., the first time point occurs at a later time than the second time point). The feedback module may then decrease the second polishing parameter to compensate for the difference between the first and second time values (e.g., by decreasing a polishing pressure applied to the region corresponding to the second data set). In some implementations, method 500 may proceed to block 550 if an absolute value of the time delta exceeds a non-zero threshold value. In some implementations, method 500 may not proceed to block 550 until it has been determined that the time delta has exceeded zero at least two times.

If at block 540 the computed time delta is equal to zero, method 500 proceeds to block 560. At block 560, the feedback module determines if the endpoint of the polishing process is reached. For example, the CMP system may have been configured to perform the polishing process for a pre-determined duration of time, and the feedback module may determine that the process is complete once the pre-determined duration of time has elapsed. If the feedback module determines that the endpoint has not been reached, method 500 then proceeds to block 570 in which the feedback module continues to receive monitored real-time polishing data (e.g., received from the CMP system) until new characteristics (e.g., local minima or local maxima) in the segment files are identifiable, and computes a new time delta between respective time points of the new characteristics. If the feedback module determines that the endpoint has been reached, method 500 ends.

Figure 6:
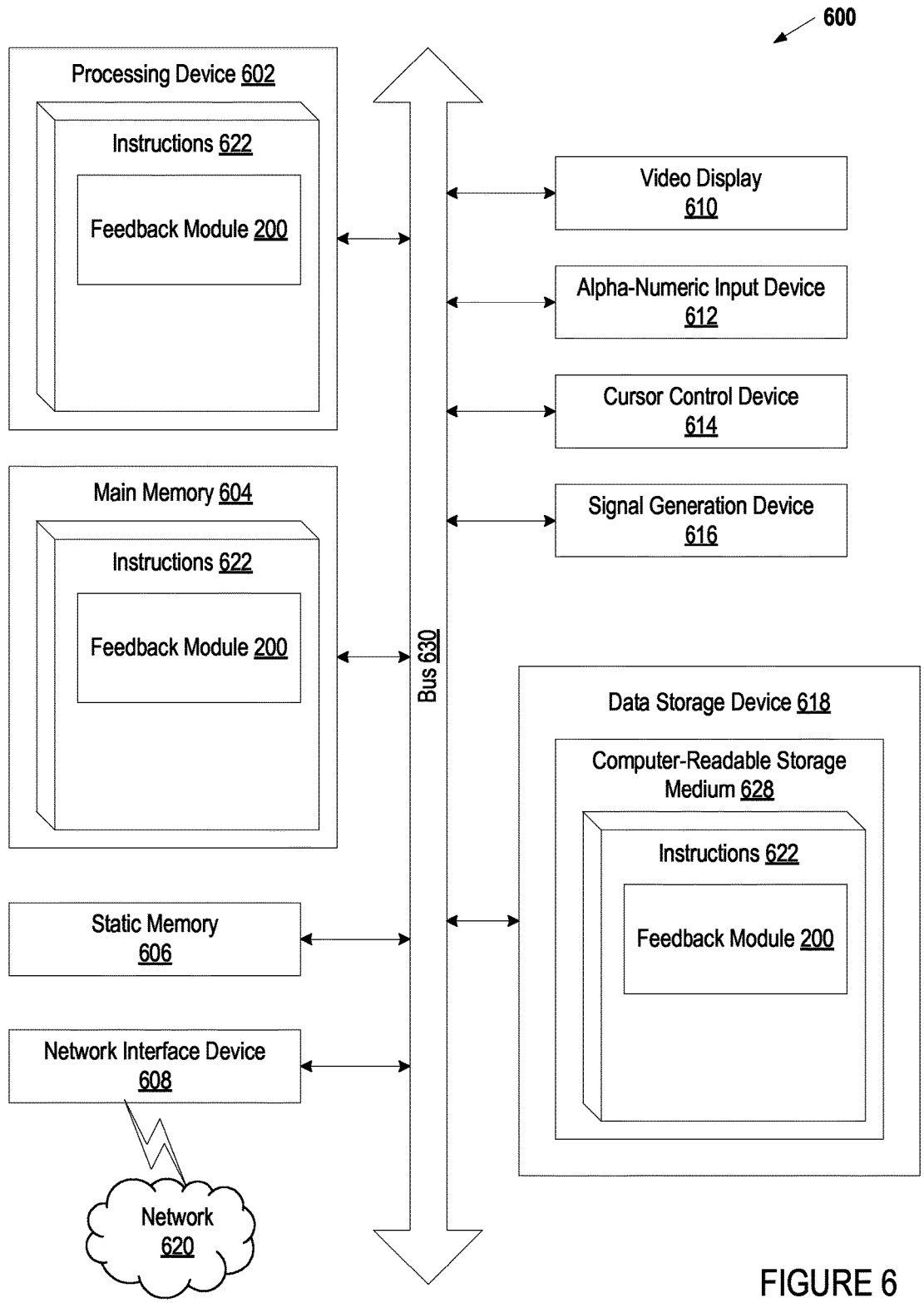
FIG. 6 is a block diagram illustrating an exemplary computing device.

FIG. 6 is a block diagram illustrating an exemplary computing device 600. In one implementation, the computing device 600 corresponds to a machine hosting the feedback module 200 of FIGS. 1 and 2. The computing device 600 includes a set of instructions for causing the machine to perform any one or more of the methodologies discussed herein. In alternative implementations, the machine may be connected (e.g., networked) to other machines in a LAN, an intranet, an extranet, or the Internet. The machine may operate in the capacity of a server machine in a client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computing device 600 includes a processing system (processing device) 602, a main memory 604 (e.g., read-only memory (ROM), flash memory, dynamic random access memory (DRAM) such as synchronous DRAM (SDRAM), etc.), a static memory 606 (e.g., flash memory, static random access memory (SRAM), etc.), and a data storage device 618, which all communicate with each other via a bus 630. Each of the processing device 602, the main memory 604, and the data storage device 618 are capable of storing instructions 622 related to the feedback module 200.

Processing device 602 represents one or more general-purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application specific integrated circuit (ASIC), a field programmable gate array (FPGA), a digital signal processor (DSP), network processor, or the like. The processing device 602 is configured to execute the feedback module 200 for performing the operations and steps discussed herein.

The computing device 600 may further include a network interface device 608. The computing device 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The data storage device 618 may include a computer-readable storage medium 628 on which is stored one or more sets of instructions (e.g., instructions 622 for feedback module 200) embodying any one or more of the methodologies or functions described herein. The feedback module 200 may also reside, completely or at least partially, within the main memory 604 and/or within the processing device 602 during execution thereof by the computing device 600, the main memory 604 and the processing device 602 also constituting computer-readable media. The feedback module 200 may further be transmitted or received over a network 620, such as network 140, via the network interface device 608.

While the computer-readable storage medium 628 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, transitory computer-readable storage media, including, but not limited to, propagating electrical or electromagnetic signals, and non-transitory computer-readable storage media including, but not limited to, volatile and non-volatile computer memory or storage devices such as a hard disk, solid-state memory, optical media, magnetic media, floppy disk, USB drive, DVD, CD, media cards, register memory, processor caches, random access memory (RAM), etc.

In the above description, numerous details are set forth. It will be apparent, however, to one of ordinary skill in the art having the benefit of this disclosure, that implementations of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "adding," "providing," or the like, refer to the actions and processes of a computing device, or similar electronic computing device, that manipulates and transforms data represented as physical (e.g., electronic) quantities within the computing device's registers and memories into other data similarly represented as physical quantities within the computing device memories or registers or other such information storage devices.

Implementations of the disclosure also relate to an apparatus for performing the operations herein. This apparatus may be specially constructed for its desired purposes, or it may comprise a general purpose computer selectively activated or reconfigured by a computer program stored in the computer. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic or optical cards, or any type of media suitable for storing electronic instructions.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   identifying, within a first data set corresponding to a first series of measurements of a first region on a wafer, a first characteristic occurring at a first time point, wherein the first data set is generated in real time while the first region on the wafer is polished according to a first polishing parameter value;
   identifying, within a second data set corresponding to a second series of measurements of a second region on the wafer, a second characteristic occurring at a second time point, wherein the second data set is generated in real time while the second region on the wafer is polished according to a second polishing parameter value;
   computing a time delta, wherein the time delta is a difference between the first time point and the second time point; and
   determining that the time delta is positive or negative, and, in response:
      decreasing the second polishing parameter value based on the time delta to decrease a polishing pressure applied to the second region if the time delta is positive; or
      increasing the second polishing parameter value based on the time delta to increase the polishing pressure applied to the second region if the time delta is negative.

2. The method of claim 1, wherein increasing or decreasing the second polishing parameter value comprises:
   identifying, using the time delta, a new parameter value from a look-up table; and
   assigning the new parameter value to the second polishing parameter value.

3. The method of claim 1, wherein the first region on the wafer is a wafer edge, and wherein the second region on the wafer is a wafer center.

4. The method of claim 1, wherein the first and second series of measurements are reflectivity measurements, and the first and second data sets correspond to first and second reflected intensity versus time data sets, respectively.

5. The method of claim 1, wherein the first and second characteristics are each local minima in the first and second data sets, respectively, or are each local maxima in the first and second data sets, respectively.

6. The method of claim 1, wherein increasing or decreasing the second polishing parameter value comprises increasing or decreasing, respectively, a pressure applied to the wafer by a polishing head.

7. A system comprising:
   a memory; and
   a processing device coupled to the memory, wherein the processing device is to:
      identify, within a first data set stored in the memory and corresponding to a first series of measurements of a first region on a wafer, a first characteristic occurring at a first time point, wherein the first data set is generated in real time while the first region on the wafer is polished according to a first polishing parameter value;
      identify, within a second data set stored in the memory and corresponding to a second series of measurements of a second region on the wafer, a second characteristic occurring at a second time point, wherein the second data set is generated in real time while the second region on the wafer is polished according to a second polishing parameter value;

compute a time delta, wherein the time delta is a difference between the first time point and the second time point; and determine that the time delta is positive or negative, and, in response:

decrease the polishing parameter value based on the time delta to decrease a polishing pressure applied to the second region if the time delta is positive; or increase the second polishing parameter value based on the time delta to increase the polishing pressure applied to the second region if the time delta is negative.

8. The system of claim 7, wherein to increase or decrease the second polishing parameter value, the processing device is further to:

identify, using the time delta, a new parameter value from a look-up table; and assign the new parameter value to the second polishing parameter value.

9. The system of claim 7, wherein the first region on the wafer is a wafer edge, and wherein the second region on the wafer is a wafer center.

10. The system of claim 7, wherein the first and second series of measurements are reflectivity measurements, and the first and second data sets correspond to first and second reflected intensity versus time data sets, respectively.

11. The system of claim 7, wherein the first and second characteristics are each local minima in the first and second data sets, respectively, or are each local maxima in the first and second data sets, respectively.

12. A non-transitory computer-readable storage medium having instructions encoded thereon that, when executed, cause a processing device to perform operations comprising:

identifying, within a first data set corresponding to a first series of measurements of a first region on a wafer, a first characteristic occurring at a first time point, wherein the first data set is generated in real time while the first region on the wafer is polished according to a first polishing parameter value;

identifying, within a second data set corresponding to a second series of measurements of a second region on the wafer, a second characteristic occurring at a second time point, wherein the second data set is generated in real time while the second region on the wafer is polished according to a second polishing parameter value;

computing a time delta, wherein the time delta is a difference between the first time point and the second time point; and determining that the time delta is positive or negative, and, in response:

decreasing the second polishing parameter value based on the time delta to decrease a polishing pressure applied to the second region if the time delta is positive; or increasing the second polishing parameter value based on the time delta to increase the polishing pressure applied to the second region if the time delta is negative.

13. The non-transitory computer-readable storage medium of claim 12, wherein increasing or decreasing the second polishing parameter value comprises:

identifying, using the time delta, a new parameter value from a look-up table; and assigning the new parameter value to the second polishing parameter value.

14. The non-transitory computer-readable storage medium of claim 12, wherein the first region on the wafer is a wafer edge, and wherein the second region on the wafer is a wafer center.

* * * * *